(12) United States Patent
Dao

(10) Patent No.: US 7,141,476 B2
(45) Date of Patent: Nov. 28, 2006

(54) METHOD OF FORMING A TRANSISTOR WITH A BOTTOM GATE

(75) Inventor: Thuy B. Dao, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 190 days.

(21) Appl. No.: 10/871,402

(22) Filed: Jun. 18, 2004

(65) Prior Publication Data

US 2005/0282318 A1    Dec. 22, 2005

(51) Int. Cl.
*H01L 21/336* (2006.01)

(52) U.S. Cl. .................. 438/283; 257/365
(58) Field of Classification Search ............ 438/155, 438/157, 280, 282, 283, 300; 257/347, 365, 257/366

See application file for complete search history.

(56) References Cited

U.S. PATENT DOCUMENTS

| | | | | |
|---|---|---|---|---|
| 5,273,921 A * | 12/1993 | Neudeck et al. | ............ | 438/157 |
| 5,773,331 A * | 6/1998 | Solomon et al. | ............ | 438/164 |
| 5,929,479 A * | 7/1999 | Oyama | .................. | 257/315 |
| 6,064,589 A * | 5/2000 | Walker | ................. | 365/149 |
| 6,284,578 B1 * | 9/2001 | Ni | .................. | 438/176 |
| 6,339,002 B1 * | 1/2002 | Chan et al. | .................. | 438/283 |
| 6,365,465 B1 * | 4/2002 | Chan et al. | .................. | 438/283 |
| 6,580,132 B1 * | 6/2003 | Chan et al. | .................. | 257/365 |
| 6,624,032 B1 * | 9/2003 | Alavi et al. | .................. | 438/283 |
| 6,642,115 B1 | 11/2003 | Cohen | | |
| 6,646,307 B1 * | 11/2003 | Yu et al. | .................. | 257/347 |
| 6,657,263 B1 * | 12/2003 | Ni | .................. | 257/371 |
| 6,762,101 B1 * | 7/2004 | Chan et al. | .................. | 438/283 |
| 6,855,982 B1 * | 2/2005 | Xiang et al. | .................. | 257/330 |
| 6,919,647 B1 * | 7/2005 | Hackler et al. | .................. | 257/250 |
| 6,946,696 B1 * | 9/2005 | Chan et al. | .................. | 257/250 |
| 6,982,460 B1 * | 1/2006 | Cohen et al. | .................. | 257/331 |
| 7,018,873 B1 * | 3/2006 | Dennard et al. | .................. | 438/149 |
| 7,074,623 B1 * | 7/2006 | Lochtefeld et al. | .................. | 438/3 |
| 2002/0140032 A1 * | 10/2002 | Cho et al. | .................. | 257/347 |
| 2004/0023460 A1 * | 2/2004 | Cohen et al. | .................. | 438/283 |
| 2004/0046207 A1 * | 3/2004 | Dennard et al. | .................. | 257/347 |
| 2004/0124917 A1 * | 7/2004 | Takagi | .................. | 330/51 |

(Continued)

OTHER PUBLICATIONS

Dao, "Advanced Double-Gate Fully-Depleted Silicon-on-Insulator (DG-FDSOI) Device and Device Impact on Circuit Design & Power Management," 2004 International Conference on Integrated Circuit Design and Technology, IEEE Central Texas Section & Japan Society of Applied Physics, May 2004, pp. 99-103.

(Continued)

*Primary Examiner*—B. William Baumeister
*Assistant Examiner*—Matthew Such
(74) *Attorney, Agent, or Firm*—David G. Dolezal; James L. Clingan, Jr.

(57) ABSTRACT

A transistor having a bottom gate formed from a layer of gate material and a channel region formed from a layer semiconductor material. In some examples, the layer of gate material is patterned separately from the layer of semiconductor material. In some examples the patterning of the layer of gate material also leaves other conductive structures that may be, in some examples, used to provide a bottom gate bias voltage to the bottom gate. In some examples, the layer of semiconductor material is formed by bonding two wafers together with a substrate of one of the wafers being cleaved, wherein a remaining portion of the semiconductor substrate is a semiconductor layer from which the channel region is formed.

29 Claims, 9 Drawing Sheets

U.S. PATENT DOCUMENTS

2005/0127412 A1* 6/2005 Cohen et al. ............... 257/288

OTHER PUBLICATIONS

Wong et al., "Device Design Considerations for Double-Gate, Ground-Plane, and Single-Gated Ultra-Thin SOI MOSFET's at the 25 nm Channel Length Generation," IEEE, 1998, pp. 15.2.1-15.2.4.

Maleville et al., "Multiple SOI Layers by Multiple Smart-Cut Transfers," IEEE, 2000, pp. 134-135.

"Two Gates are Better Than One, A Planar Self-Aligned Double-Gate MOSFET Technology to Achieve the Best On/Off Switching Ratios as Gate Lengths Shrink," IEEE Circuits & Devices Magazine, Jan. 2003, pp. 48-62.

Erin C. Jones, Meikei Ieong, Thomas Kanarsky, Omer Dokumaci, Ronnen A. Roy, Leathen Shi, Toshiharu Furukawa, Robert J. Miller and H-S Philip Wong, High Performance of Planar Double Gate MOSFETs with Thin Backgate Dielectrics, IBM T.J. Watson Research Center, Yorktown Heights, NY pp. 28-29, Device Research Conference 2001.

* cited by examiner

METHOD OF FORMING A TRANSISTOR WITH A BOTTOM GATE

BACKGROUND OF THE INVENTION

1. Field of the Invention

This invention relates in general to semiconductor devices and more specifically to transistors.

2. Description of the Related Art

As transistors shrink in dimension, the ability to scale down the gate length of a conventional bulk silicon MOSFET diminishes due to the Short Channel Effect (SCE). Single Gate Fully Depleted Semiconductor-on-Insulator (FDSOI) technology has been established as one solution to reduce Short Channel Effect as well as to reduce un-wanted parasitic capacitances. However, Single Gate FDSOI technology may require stringent thickness and uniformity control of the thin silicon film on insulator to achieve full depletion. Furthermore, the Drain-Induced Virtual Substrate Biasing (DIVSB) effect is another challenge for Single Gate FDSOI technology. In contrast, Double-Gate FDSOI technology may require a less stringent requirement on the thickness of a semiconductor on insulator, may reduce the Drain Induced Virtual Substrate Biasing (DIVSB) effect, and may maintain better Short Channel Effect (SCE) control and high transconductance. However, it has been difficult to build a simple, manufacturable planar Double Gate FDSOI transistor with good alignment between the top gate and bottom gate.

What is needed is an improved method that can be used in forming a multiple gate transistor.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

The following sets forth a detailed description of a mode for carrying out the invention. The description is intended to be illustrative of the invention and should not be taken to be limiting.

Figure 1:
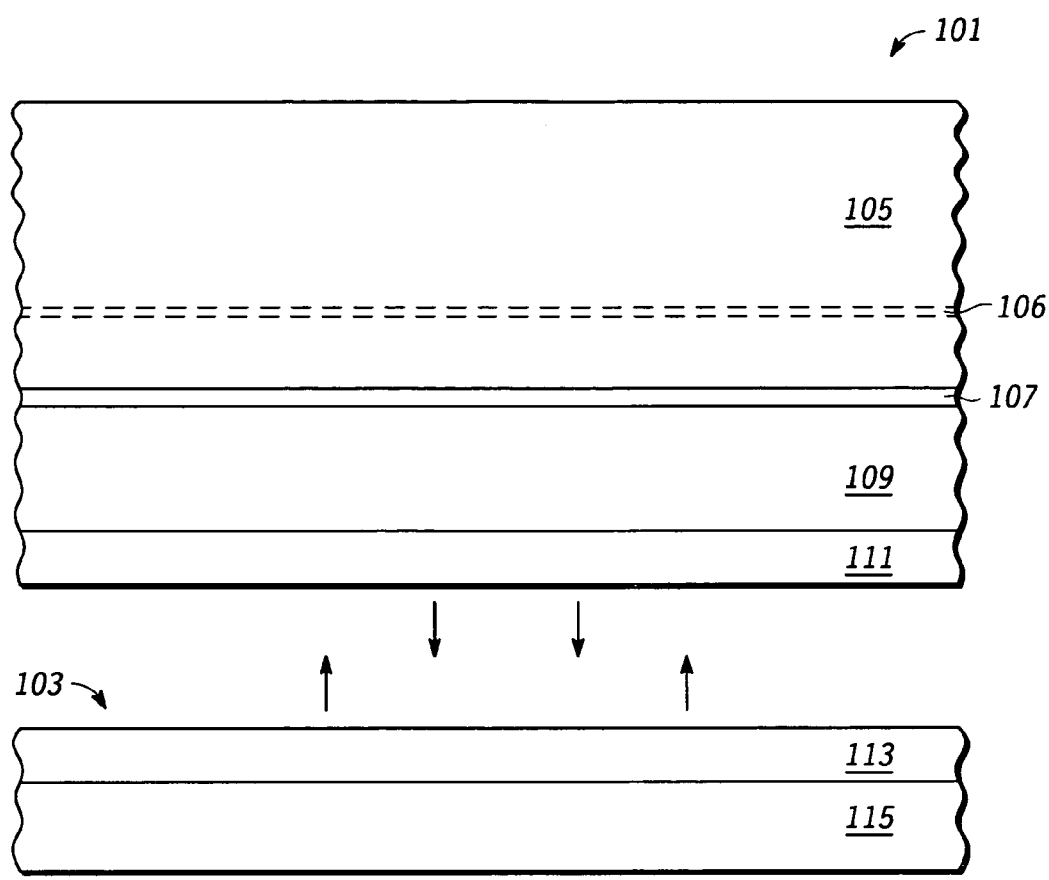
FIG. 1 is a side view of one embodiment of two wafers being bonded together to form a resultant wafer according to the present invention.
Figure 2:
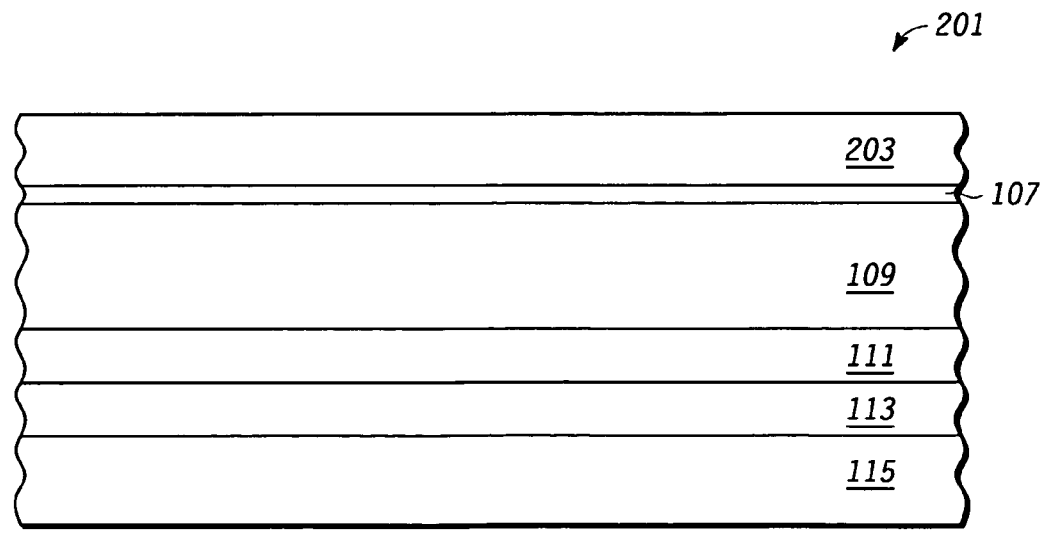
FIG. 2 shows a side view of one embodiment of a resultant wafer according to the present invention.

FIG. 1 shows a side view of two wafers 101 and 103 that are to be bonded together to form a resultant wafer (201 of FIG. 2). Wafer 101 includes a layer 109 of bottom gate material, bottom gate dielectric 107, and semiconductor substrate 105. In the embodiment shown, the material for the channel regions of double gate transistors to be formed is located in substrate 105. In one embodiment, substrate 105 is made of monocrystaline silicon, but in other embodiments, may be made of other types of semiconductor materials such as silicon carbon, silicon germanium, gennanium, type III–V semiconductor materials, type II–VI semiconductor materials, and combinations thereof including multiple layers of different semiconductor materials. In some embodiments, semiconductor material of substrate 105 may be strained.

Bottom gate dielectric 107 is made of silicon oxide, but may be made of other dielectrics in other embodiments such as e.g. oxynitride, hafnium oxide, aluminum oxide, tantalum oxide, lantanium oxide, hafnium oxynitride, iridium oxynitride and/or other high K dielectric materials. Dielectric 107 may be formed e.g. by a growing process or by a deposition process.

In forming wafer 101, layer 109 of bottom gate material is deposited on dielectric 107. In one embodiment, layer 109 includes doped polysilicon, but may be made of other materials such as e.g. amorphous silicon, tungsten, tungsten silicon, germanium, amorphous germanium, titanium, titanium nitride, titanium silicon, titanium silicon nitride, tantalum, tantalum silicon, tantalum silicon nitride, other silicide materials, other metals, or combinations thereof including multiple layers of different conductive materials.

An insulator 111 is formed (e.g. grown or deposited) on layer 109. In one embodiment, insulator 111 includes silicon oxide, but may include other materials such as e.g. PSG, FSG, silicon nitride, and/or other types of dielectric including high thermal, conductive dielectric materials.

Wafer 103 includes a substrate 115 of e.g. silicon with an insulator 113 formed there over. In one embodiment, the material of insulator 113 is the same as the material of insulator 111.

In some embodiments, wafer 103 includes a metal layer (not shown) at a location in the middle of insulator 113. This metal layer may be utilized for noise reduction in analog devices built from resultant wafer 201.

Wafer 101 is shown inverted so as to be bonded to wafer 103 in the orientation shown in FIG. 1. In one embodiment, insulator 111 is bonded to insulator 113 with a bonding material. In other embodiments, wafer 101 may be bonded to wafer 103 using other bonding techniques. For example, in one embodiment, wafer 101 may be bonded to wafer 103 by electrostatic bonding followed by thermal bonding or pressure bonding.

In some embodiments, wafer 101 does not include insulator 111 where layer 109 is bonded to insulator 1113. In other embodiments, wafer 103 does not include insulator 113 where insulator 111 is bonded to substrate 115.

Wafer 101 includes a stress layer 106 formed by implanting a dopant (e.g. H+) into substrate 105. In some embodiments, the dopant is implanted prior to the formation of dielectric 107, but in other embodiments, may be implanted at other times including after the formation of dielectric 107 and prior to the formation of layer 109, after the formation of layer 109 and prior to the formation of insulator 111, or after the formation of insulator 111. In other embodiments, the dopant for forming stress layer 106 may be implanted after wafer 103 has been bonded to wafer 101.

FIG. 2 shows a side view of resultant wafer 201 after wafer 103 and 101 have been bonded together. The view in FIG. 2 also shows wafer 201 after a top portion of substrate 105 has been removed e.g. cleaving. In one embodiment, cleaving is performed by dividing substrate 105 at stress layer 106. Layer 203 is the remaining portion of substrate 105 after the cleaving.

One advantage of forming the channel region layer by cleaving is that it may allow for a channel region to be formed from a relatively pure and crystalline structure as opposed to a semiconductor layer that is grown or deposited on a dielectric (e.g. dielectric 107).

Figure 3:
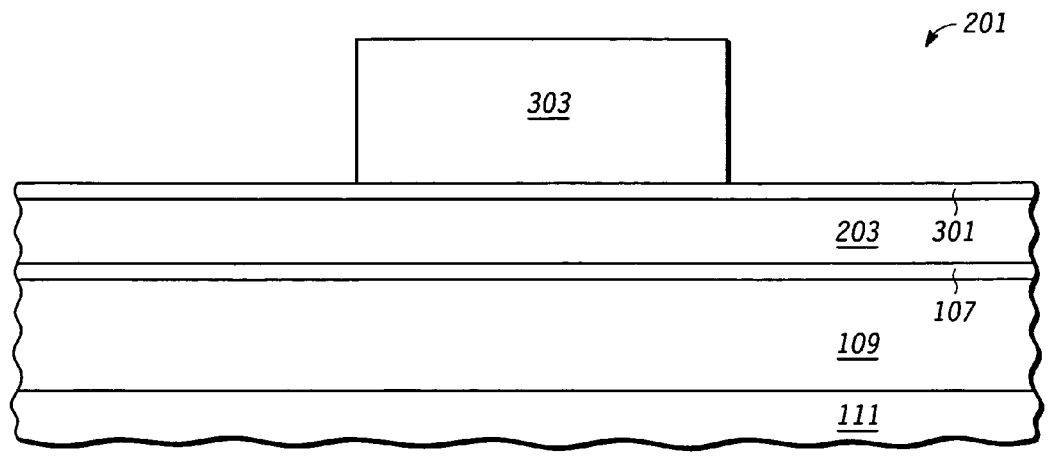
FIG. 3 shows a partial cross-sectional side view of one embodiment of a wafer during a stage in its manufacture according to the present invention.

FIG. 3 shows a partial side cross-sectional view of wafer 201. Not shown in the view of FIG. 3 (or in subsequent Figures) are insulator 113 and substrate 115. After substrate 105 is cleaved to form layer 203, a sacrificial dielectric layer 301 (e.g. nitride or oxide) is formed on layer 203 (e.g. by growing or depositing). A patterned mask 303 is then formed over layer 301. In one embodiment, mask 303 is formed by patterning a layer of photo resist.

Figure 4:
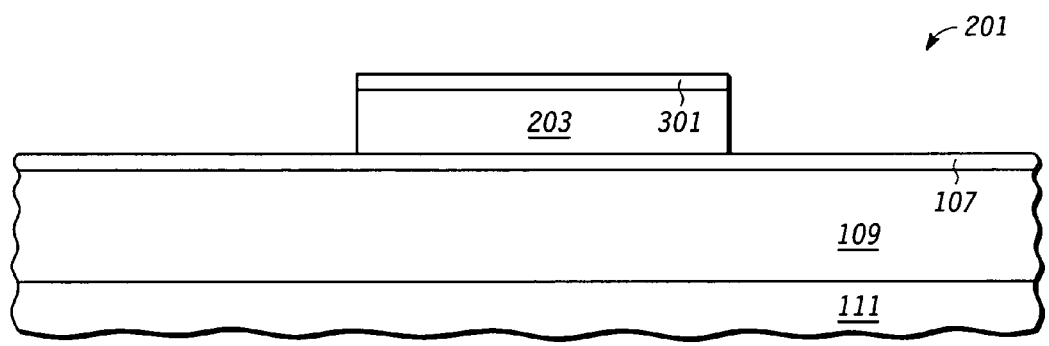
FIG. 4 shows a partial cross-sectional side view of one embodiment of a wafer during another stage in its manufacture according to the present invention.

FIG. 4 is a partial side cross-sectional view of wafer 201 after layers 301 and 203 have been patterned using mask 303 and after mask 303 has been removed. The channel of a double gate transistor will be subsequently formed in the remaining portion of layer 203.

Figure 5:
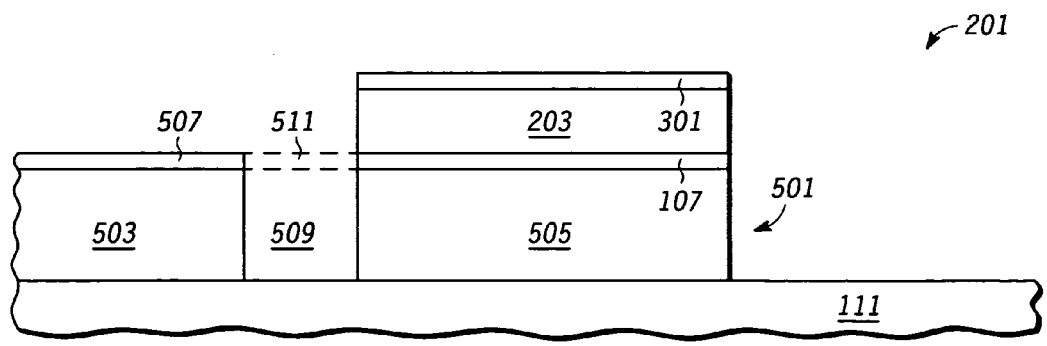
FIG. 5 shows a partial cross-sectional side view of one embodiment of a wafer during another stage in its manufacture according to the present invention.

After layer 203 has been patterned, a second mask is patterned (not shown) to pattern layer 109. Structure 501 is formed from layer 109 by the patterning. In the embodiment shown, structure 501 includes two portions shown in the cross section of FIG. 5. Portion 505 is located under the remaining portion of layer 203 and portion 503 is located laterally from portion 505. Structure 501 includes another portion 509 (as indicated by the dashed lines) that is not located in the cross section of FIG. 5. Portion 509 physically connects portion 503 to portion 505. The bottom gate of the double gate transistor will be formed from portion 505. Portion 503 may be utilized as a contact pad, local interconnect, capacitor electrode, inductor, resistor, or other conductive structure, which may be, in some embodiments, electrically coupled to the bottom gate. In one embodiment, portion 503 is utilized to provide a bias voltage to the bottom gate of the double gate transistor. In some embodiments, portion 503 is separate from portion 505. In other embodiments, portion 503 is separated from portion 505 by subsequent processes. Dielectric 107 is also patterned with layer 109.

Patterning the layer of bottom gate material separate from the layer of channel region material, may in some embodiments, enable independent formation of structures in the bottom gate layer outside of the channel region structures, thereby providing for a greater flexibility in the manufacture of Circuits with multiple gate transistors.

Figure 6:
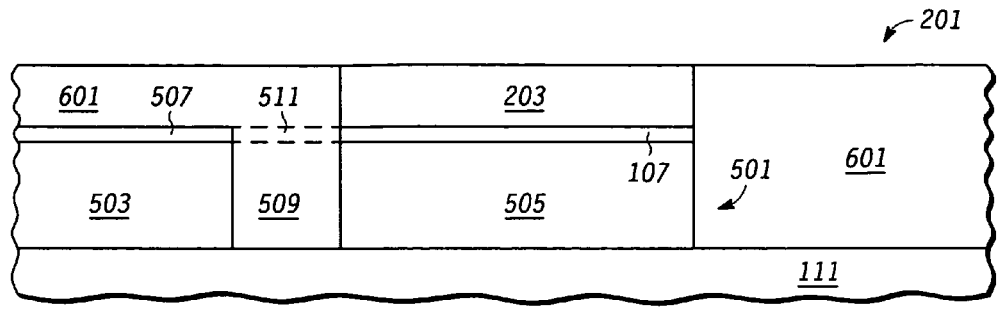
FIG. 6 shows a partial cross-sectional side view of one embodiment of a wafer during another stage in its manufacture according to the present invention.

FIG. 6 shows a partial cross-sectional side view of wafer 201 after a layer of dielectric 601 (e.g. silicon oxide, TEOS, or CVD oxide) is deposited over wafer 201 and wafer 201 is then subject to a chemical mechanical polish (CMP) to planarize. In one embodiment, layer 301 is used as a polish stop for the CMP, where afterwards, a wet etch is used to remove layer 301.

Figure 7:
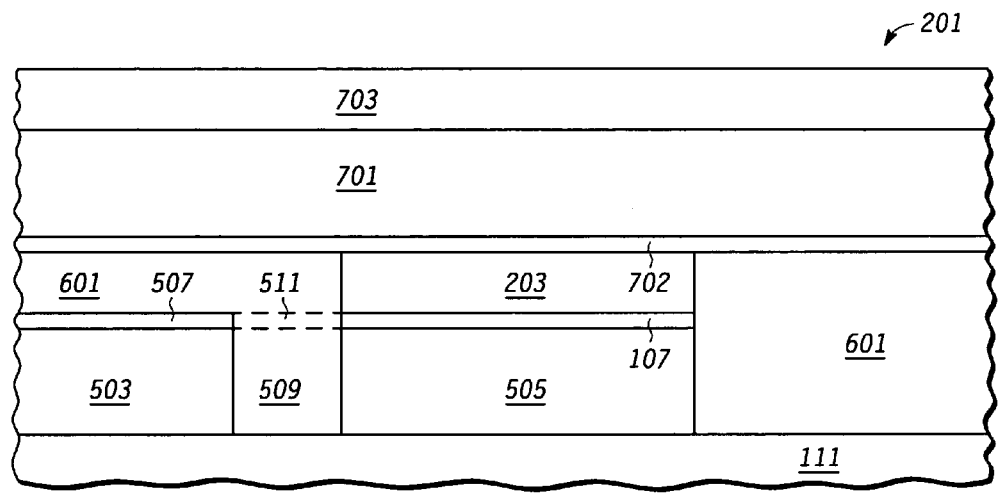
FIG. 7 shows a partial cross-sectional side view of one embodiment of a wafer during another stage in its manufacture according to the present invention.

FIG. 7 shows a partial cross-sectional side view of wafer 201 after a top gate dielectric 702, a layer 701 of top gate material, and a hard mask 703 are formed over wafer 201. In one embodiment, top gate dielectric is hafnium oxide, but may be made of other dielectric material in other embodiments. In one embodiment, layer 701 is made of polysilicon, but may be made of other materials including the materials set forth above with respect to layer 109. In one embodiment, hard mask 703 is made of a dielectric (e.g. oxide (e.g. TEOS) or nitride) and/or may be formed by a CVD process (e.g. LPCVD, MOCVD). In some embodiments, hard mask 703 may be made of multiple layers of different materials. Hard mask 703 is utilized to protect layer 701 during subsequent processing.

Figure 8:
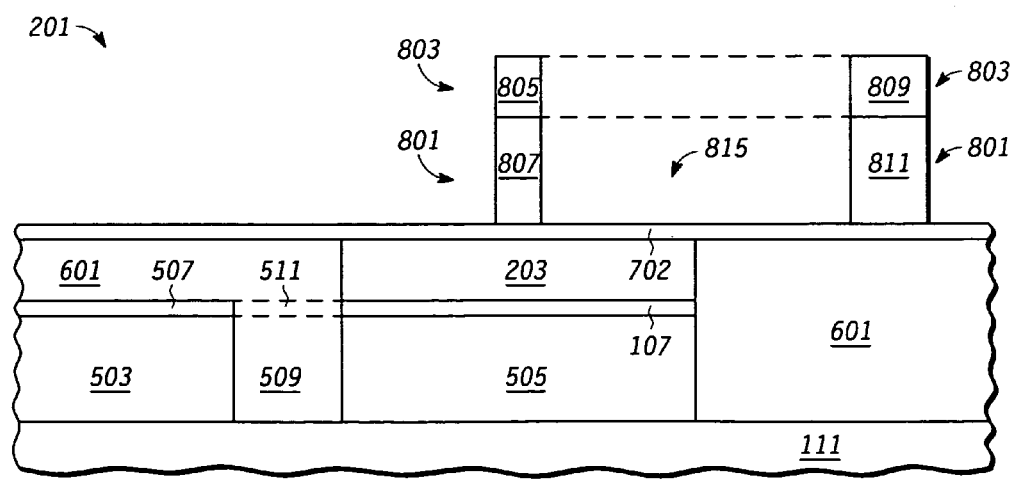
FIG. 8 shows a partial cross-sectional side view of one embodiment of a wafer during another stage in its manufacture according to the present invention.

FIG. 8 shows a partial side cross-sectional view of wafer 201 after hard mask 703 and layer 701 have been patterned to form structures 803 and 801 respectively. Structure 801 includes a portion 807 from which the top gate of a double gate transistor will be formed. Structure 801 also includes a portion 811 from which a conductive structure (e.g. an interconnect, contact pad, capacitor structure, inductor, resistor, or other conductive structure) will be formed. In the embodiment shown, structure 801 includes a portion 815 not located in the cross section of FIG. 8 (shown in dashed lines) which physically connects portion 807 to portion 811. In some embodiments, portion 807 is separate from portion 811. In other embodiments, portion 807 is separated from portion 811 is subsequent processes. Structure 803 includes a portion 805 located over portion 807 and a portion 809 located over portion 811. In one embodiment, structures 801 and 803 are patterned with a patterned mask (not shown) formed over hard mask 703.

Figure 9:
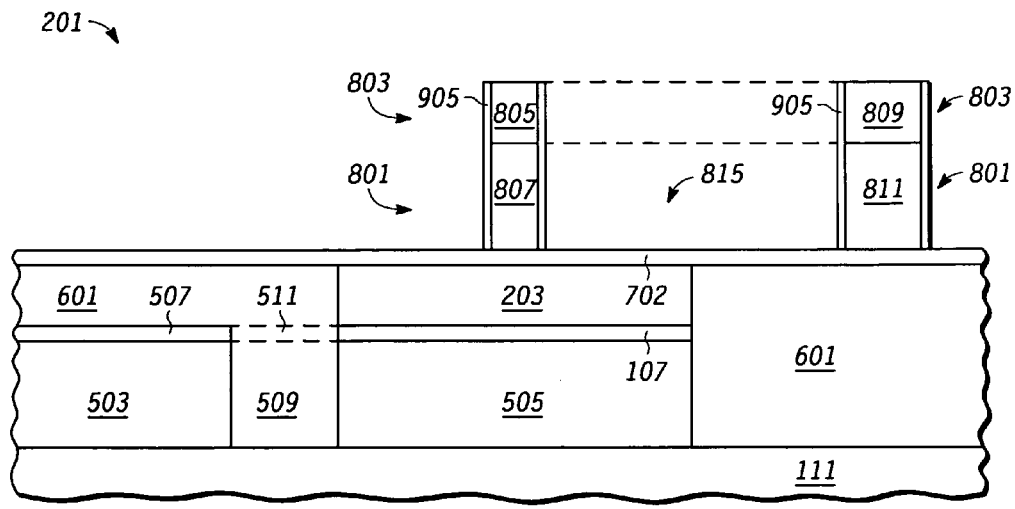
FIG. 9 shows a partial cross-sectional side view of one embodiment of a wafer during another stage in its manufacture according to the present invention.

FIG. 9 shows a partial cross-sectional side view of wafer 201 after spacer 905 is formed on the sidewalls of structures 803 and 801. In one embodiment, spacer 905 is a dielectric (e.g. oxide, nitride, or combinations thereof). In some embodiments, the dielectric may include multiple layers of dielectric materials. In some embodiments, dopant is implanted into layer 203 for forming source/drain extensions when the wafer is at the stage shown in FIG. 9. In some embodiments, this doping is performed after the dielectric material of spacer 905 is deposited but prior to the anisotropic etch to form the spacers from the dielectric material.

Figure 10:
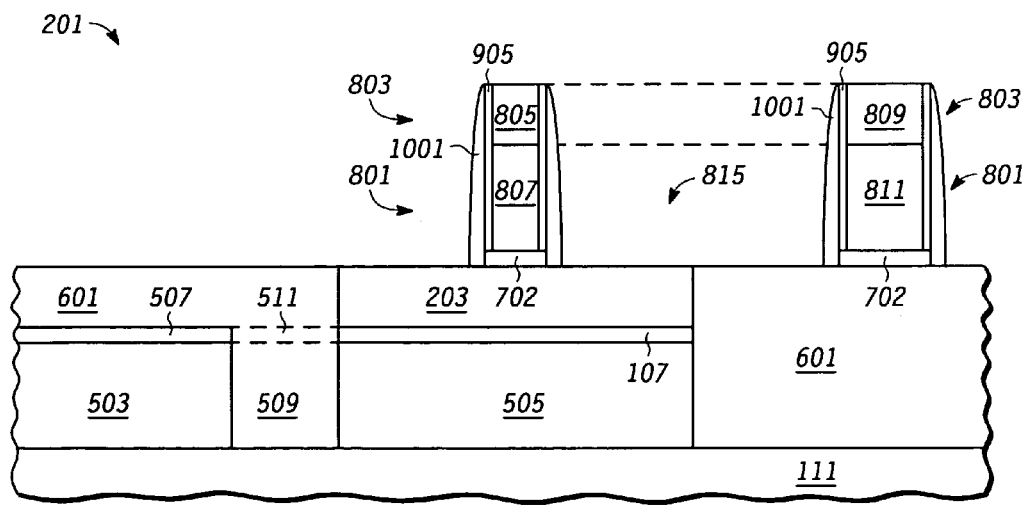
FIG. 10 shows a partial cross-sectional side view of one embodiment of a wafer during another stage in its manufacture according to the present invention.

FIG. 10 shows a partial cross-sectional side view of wafer 201 after an exposed portion of top gate dielectric 702 is removed and another dielectric spacer 1001 is subsequently formed on the sidewalls of spacer 905. In one embodiment, the exposed portion of dielectric 702 is remove by an anisotropic dry etch process selective with respect to the material of layer 203, but may be removed by other processes in other embodiments. In one embodiment, spacer 1001 is a dielectric (e.g. oxide, nitride, or combinations thereof). In some embodiments, the dielectric may include multiple layers of dielectric materials. In some embodiments, the formation of spacer 1001 is omitted e.g. where subsequent etching processes do not introduce contaminants.

Figure 11:
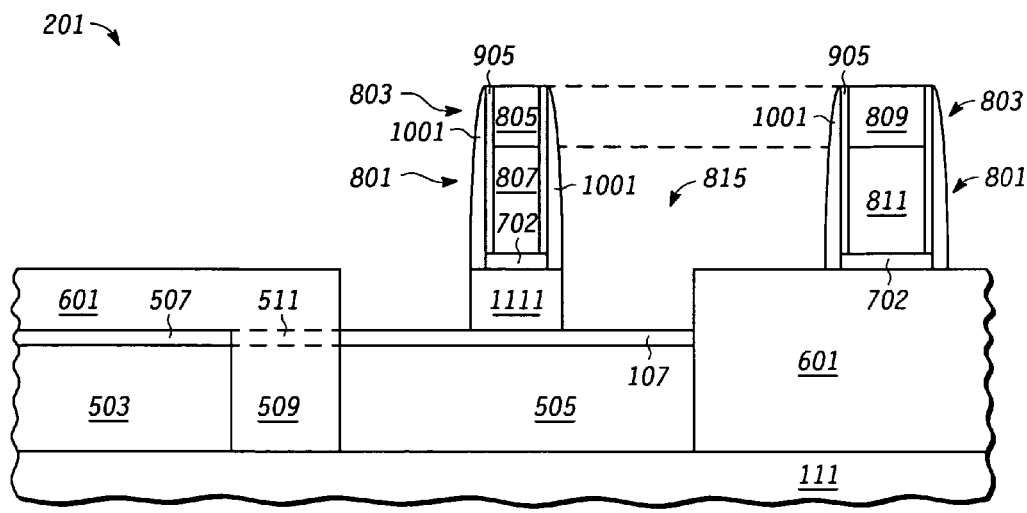
FIG. 11 shows a partial cross-sectional side view of one embodiment of a wafer during another stage in its manufacture according to the present invention.

FIG. 11 shows a partial cross-sectional side view of wafer 201 after the exposed portion of layer 203 of channel material is removed to form channel region structure 1111. In one embodiment, the exposed portion of layer 203 is remove by an anisotropic dry etch that is stopped on dielectric 107.

Figure 12:
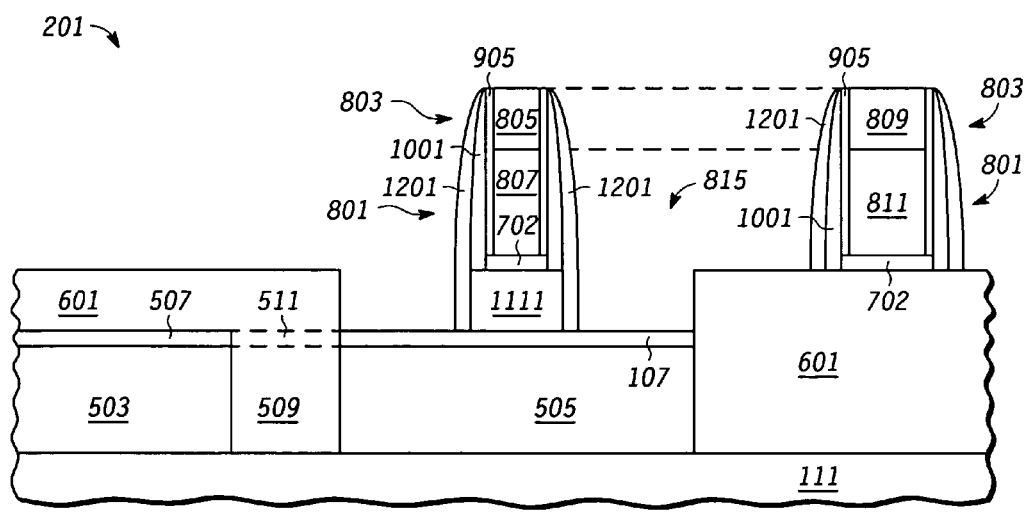
FIG. 12 shows a partial cross-sectional side view of one embodiment of a wafer during another stage in its manufacture according to the present invention.

FIG. 12 shows a partial cross-sectional side view of wafer 201 after a spacer 1201 is formed on the sidewalls of spacer 1001 and channel region structure 1111. In one embodiment, spacer 1201 is made of nitride, oxide, or combinations thereof. In some embodiments, spacer 1201 may be made of multiple layers of dielectric materials. Spacer 1201 protects exposed portions of channel region structure 1111 during subsequent processing. In some embodiments, the formation of spacer 1201 is omitted e.g. where subsequent etching processes do not introduce contaminants.

Figure 13:
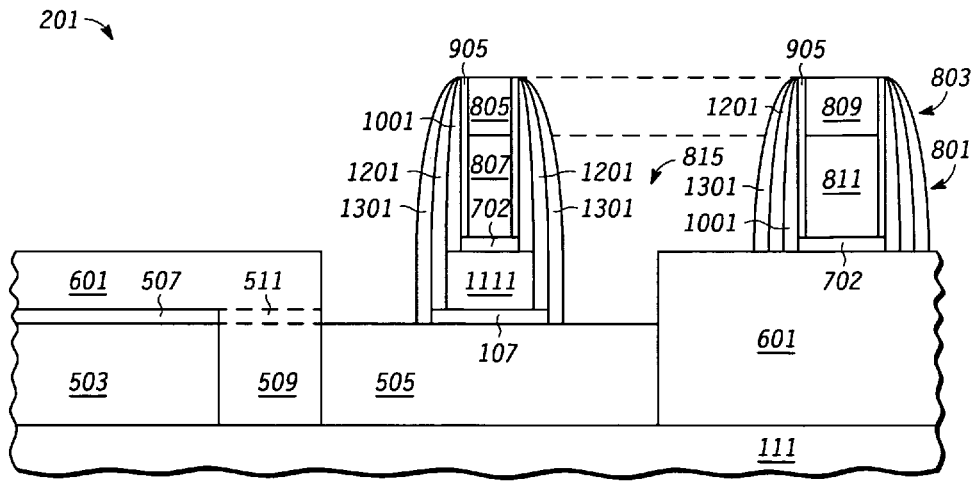
FIG. 13 shows a partial cross-sectional side view of one embodiment of a wafer during another stage in its manufacture according to the present invention.

FIG. 13 shows a partial cross-sectional side view of wafer 201 after an exposed portion of gate dielectric 107 is removed by e.g. an anisotropic etch. Also, shown in FIG. 13, a dielectric spacer 1301 is formed on the sidewalls of spacer 1201 and on the exposed sidewalls of the remaining portion of bottom gate dielectric 107. In one embodiment, spacer 1301 is made of nitride, oxide, or a combination thereof. In some embodiments, spacer 1301 may be made of multiple layers of dielectric materials. In some embodiments, the formation of spacer 1301 is omitted e.g. where subsequent etching processes do not introduce contaminants.

Figure 14:
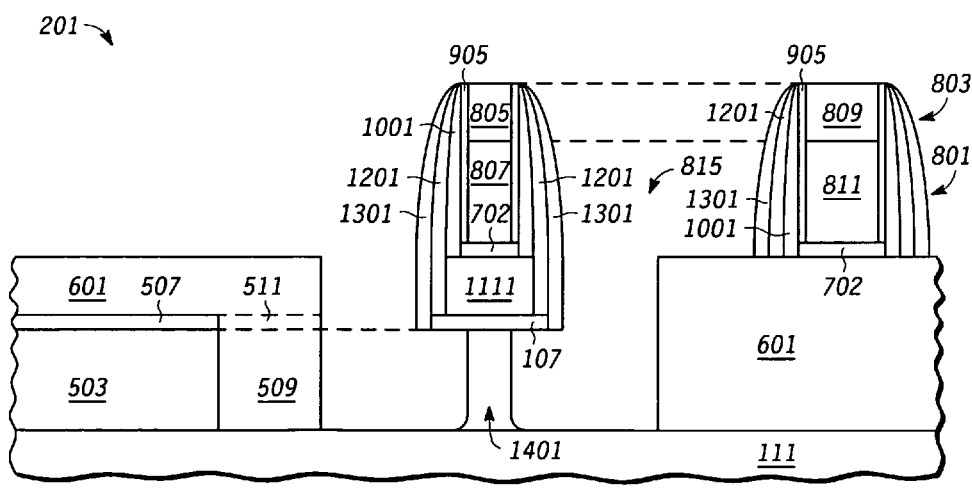
FIG. 14 shows a partial cross-sectional side view of one embodiment of a wafer during another stage in its manufacture according to the present invention.

FIG. 14 shows a partial cross-sectional side view of wafer 201 after portion 505 has been etched to remove all but a portion located under portion 807 of structure 801 to form a bottom gate 1401. In the embodiment shown, portions of portion 505 are removed by performing an anisotropic etch down to insulator 111 followed by a dry, isotropic etch. During the etching, portions 805 and 807 (as well as the spacers and channel region structure 1111) are used as a mask.

In one embodiment, the portion of portion 505 removed during the etchings may be previously doped to enhanced the isotropic etch characteristics with respect to the portion of portion 505 which remains to form gate 1401. This doping may take place at the stages shown in FIG. 8 or FIG. 9 wherein portions 805 and 807 are used as a mask to prevent the dopant from being implanted in the portion of portion 505 from which gate 1401 is formed. In one embodiment, the doping may be performed after the dielectric material of spacer 905 is deposited but prior to that material being anisotropically etched to form the spacer. In one embodiment, gate 1401 has approximately the same width as portion 807. In some embodiments, the width of gate 1401 maybe narrower than portion 807 to reduce Miller capacitance e.g. for applications such as analog or RF applications. In other embodiments, the width of gate 1401 maybe slightly wider than portion 807 to increase gain e.g. for digital applications.

Figure 15:
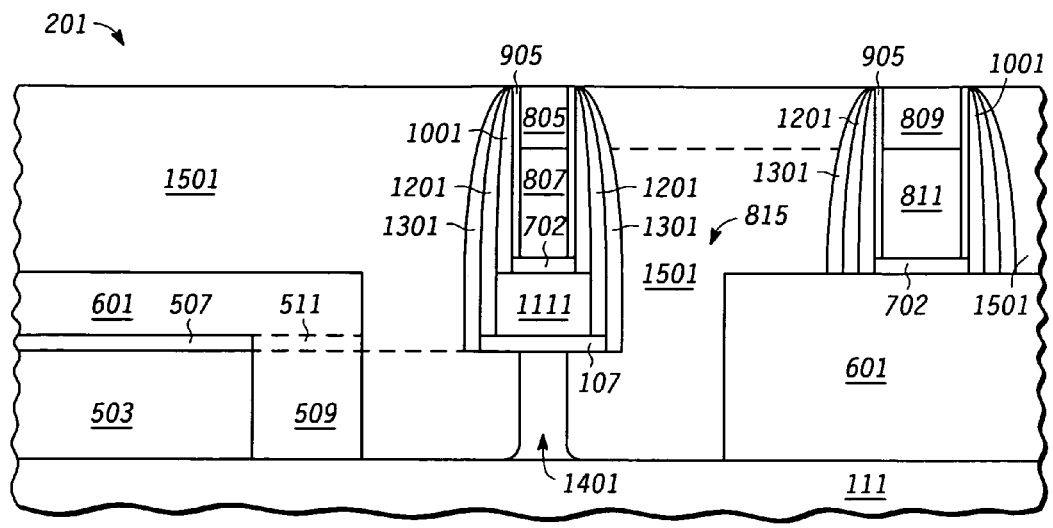
FIG. 15 shows a partial cross-sectional side view of one embodiment of a wafer during another stage in its manufacture according to the present invention.

FIG. 15 shows a partial cross-sectional side view of wafer 201 after a dielectric 1501 (e.g. silicon oxide, CVD oxide, TEOS) is deposited over wafer 201. Wafer 201 is then subject to a CMP process using structure 803 as a polishing stop.

Figure 16:
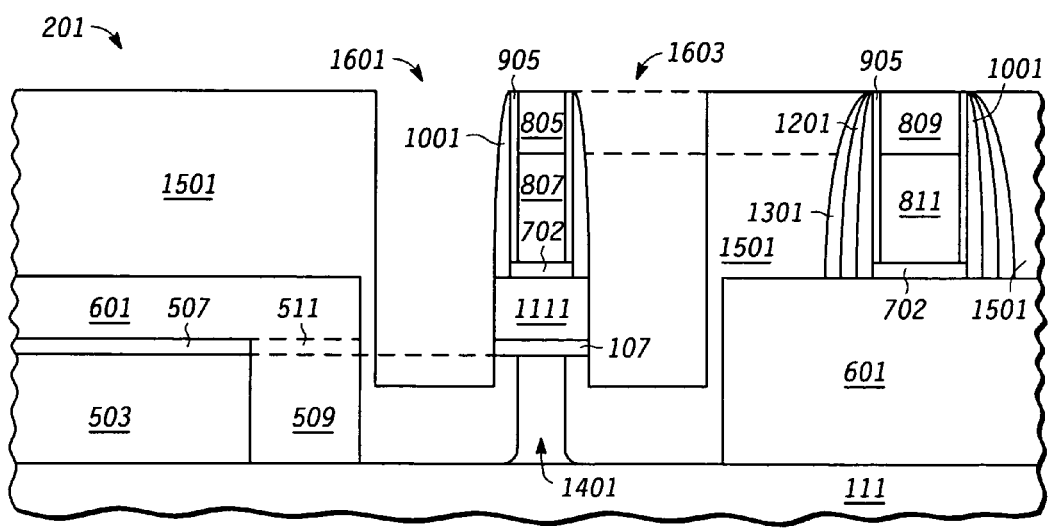
FIG. 16 shows a partial cross-sectional side view of one embodiment of a wafer during another stage in its manufacture according to the present invention.

FIG. 16 shows a partial cross-sectional side view of wafer 201 after openings 1601 and 1603 are formed. In one embodiment, openings 1601 and 1603 are formed by an anisotropic etch for a predetermined depth or a predetermined time. This etching exposes the sidewalls of channel region structure 1111.

Figure 17:
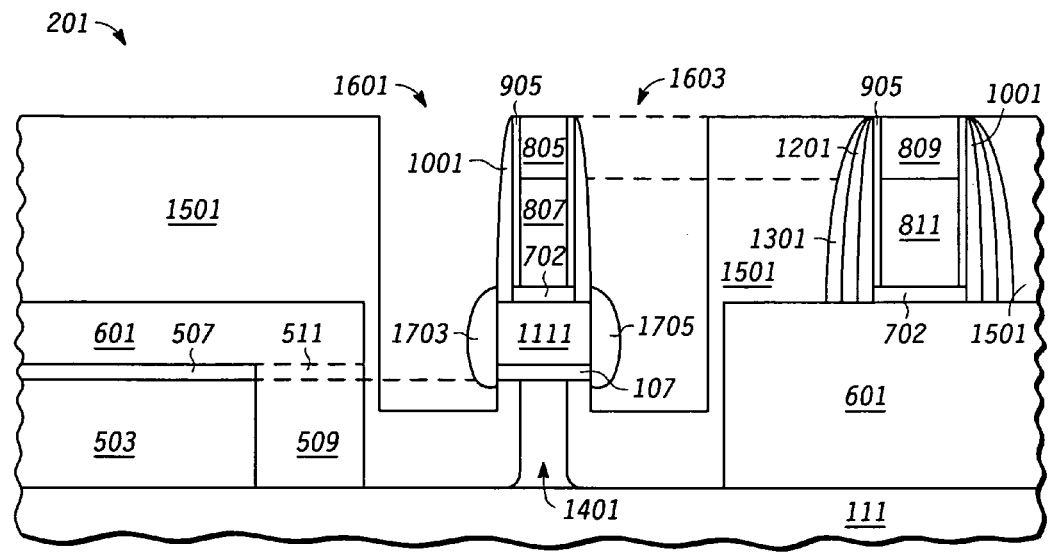
FIG. 17 shows a partial cross-sectional side view of one embodiment of a wafer during another stage in its manufacture according to the present invention.

FIG. 17 shows a partial cross-sectional side view of wafer 201 after selective epitaxially silicon structures 1703 and 1705 are grown on the exposed sidewalls of channel region structure 1111. Structures 1703 and 1705 are grown beyond the bottom gate dielectric 107 and top gate dielectric 702 in the embodiment shown. In other embodiments, structures 1703 and 1705 may include other selective epitaxial films corresponding to those described for substrate 105. In other embodiments, structures 1703 and 1705 may be selectively deposited and may include materials as described for materials 1803 and 1805.

One advantage of using epitaxially grown structures are that they allow for good interface between the channel region and the subsequently formed source drain region structures.

Figure 18:
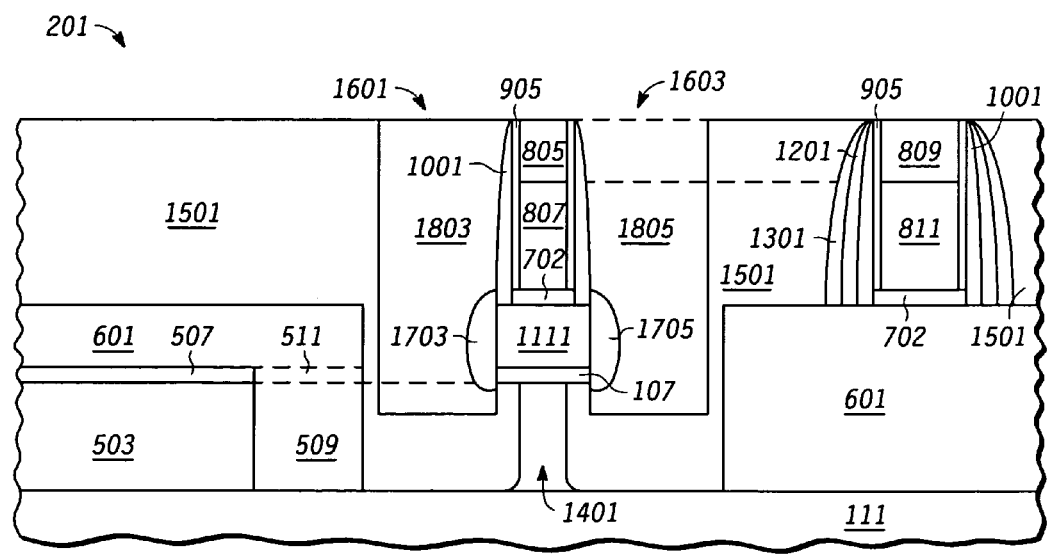
FIG. 18 shows a partial cross-sectional side view of one embodiment of a wafer during another stage in its manufacture according to the present invention.

FIG. 18 shows a partial cross-sectional side view of wafer 201 after conductive material 1803 and 1805 is deposited into openings 1601 and 1603. In one embodiment, material 1803 and 1805 includes polysilicon, but may include other conductive material in other embodiments. In other embodiments, material 1803 and 1805 may includes multiple layers of different conductive material, e.g. tungsten, germanium. Afterwards, wafer 201 is subject to a CMP process using structure 803 and dielectric 1501 as a polishing stop. In other embodiments, wafer 201 is subjected to a CMP process using structure 801 as a polishing stop.

In some embodiments, the formation of epitaxially grown silicon may be omitted. In other embodiments, a raised/source drain structure may be included. Referring back to FIG. 10, a layer of semiconductor material (not shown) would grown or deposited on layer 203. Spacers (not shown) would then be formed on the side walls of spacer 1001 which would cover a portion of the layer of semiconductor material. The rest of the layer of semiconductor material (not under the additional spacers) as well as the portion of layer 203 would then be removed. Subsequently, spacers 1201 would also be formed on the sidewalls of this additional structure.

Figure 19:
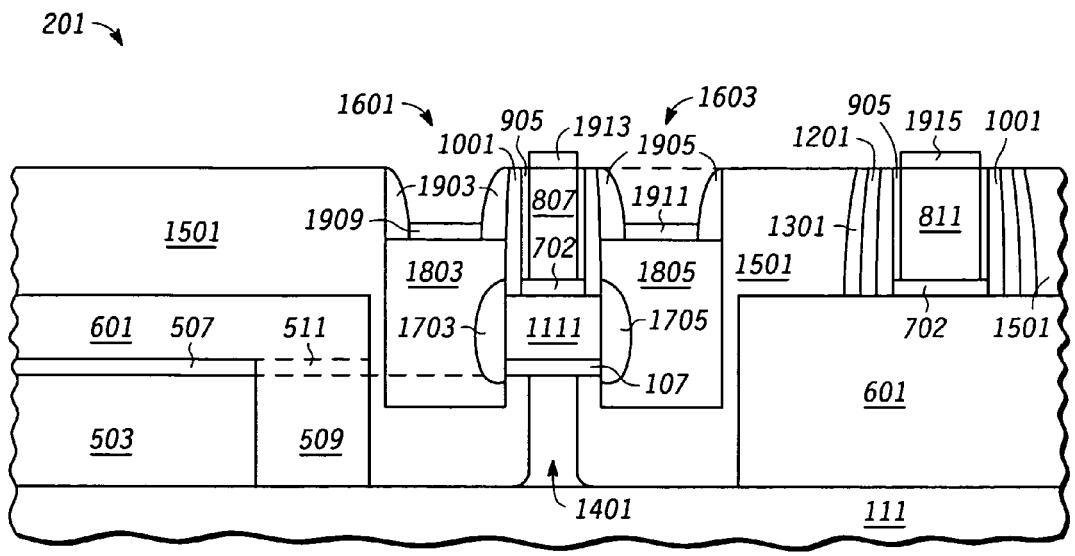
FIG. 19 shows a partial cross-sectional side view of one embodiment of a wafer during another stage in its manufacture according to the present invention.

FIG. 19 shows a partial cross-sectional side view of wafer 201 after conductive material 1803 and 1805 have been etched (e.g. with an anisotropic etch) to the level shown in FIG. 19. FIG. 19 also shows wafer 201 after wafer 201 was subject to an etch to remove hard mask structure 803 (and the portions of the spacers adjacent to its sidewalls) as well as a portion of dielectric 1501. In other embodiments, wafer 201 is subjected to a CMP process using structure 801 as a polishing stop. In other embodiments, wafer 201 is subjected to a CMP process that stops within structure 803. After this etch, dielectric sidewall spacers 1903 and 1905 are formed on the sidewalls of opening 1601 and 1603.

In some embodiments, source/drain implants are made in conductive material 1803 and 1805 for forming the source/drain regions. These implants may be made prior to the formation of spacers 1903 and 1905 and/or after the formation of spacers 1903 and 1905.

Also shown in FIG. 19 are source/drain silicides 1909 and 1911 formed after the formation of spacers 1903 and 1905. Gate suicides 1913 and 1915 are formed on top gate portion 807 and on portion 811. In one embodiment, the silicides are performed using a silicide implantation (e.g. cobalt, nickel) followed by a heat treatment. In other embodiments, the silicide may be formed by depositing a layer of metal over the wafer and reacting the metal with the underlying material.

Figure 20:
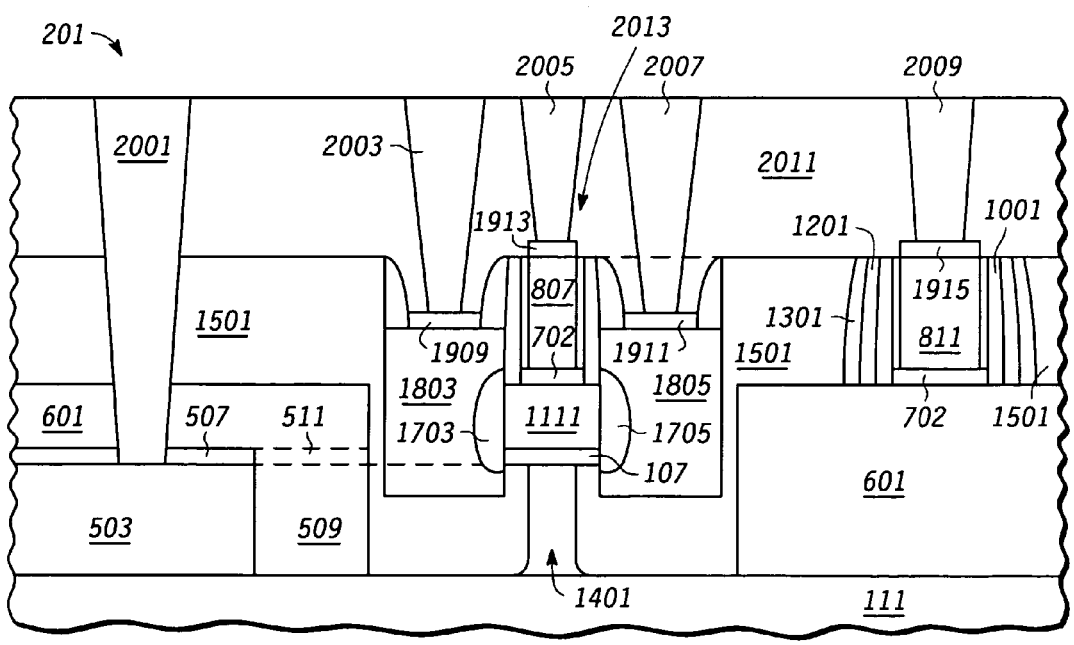
FIG. 20 shows a partial cross-sectional side view of one embodiment of a wafer during another stage in its manufacture according to the present invention.

FIG. 20 shows a partial cross-sectional side view of wafer 201 after a dielectric layer (e.g. of oxide, CVD oxide, TEOS, PSG, BPSG, FSG, or low K dielectrics) 2011 is formed over wafer 201. Also shown in FIG. 20 are gate contact 2005, source/drain contacts 2003 and 2007, contact 2001 which is in electrical contact with portion 503, and contact 2009 which is in electrical contact with portion 811 through silicide 1915. In one embodiment, these contacts are formed by forming openings in wafer 201 and subsequently depositing conductive material (e.g. tungsten) in the opening. In some embodiment, the contacts may include barrier layers (not shown).

FIG. 20 shows a double gate transistor 2013 with a top gate (portion 807) and a bottom gate 1401. Transistor 2013 has a source/drain region implemented in conductive material 1803 and structure 1703 and a source/drain region implemented in conductive material 1805 and silicon 1707. A portion of the source/drain extensions may be located on the ends of channel region structure 1111. Transistor 2013 has a channel region located in channel region structure 1111. In one embodiment, transistor 2013 is a fully depleted SOI double gate transistor. Transistor 2013 may be either a P-channel or N-channel transistor, depending upon the doping of the source/drain regions. In other embodiments, other types of transistors including other types of multiple gate transistors may be formed with processes described herein.

Wafer 201 may be subject to subsequent processing steps such e.g. forming additional interconnect layers, forming external conductive structures (e.g. bond pads), forming capping layers, and sinugalation of the wafer into individual integrated circuits. Wafer 201 includes other double gate transistors (not shown).

In other embodiments, isolation trenches may be formed around active areas (e.g. during the etching of the bottom gate or during the etching of layer 203). Also processes describe herein may be utilized in integrated circuits having areas of circuitry with different gate dielectric thicknesses.

In other embodiments, during the etching of the openings in dielectric 2011 for contacts 2003 and 2007, spacers 1903 and 1905 can be used as etch stops for making contacts 2003 and 2007 self aligned so as to enhance circuit density and process margin.

In some embodiments, wafer 201 includes a through gate contact (not shown) which is in electrical contact with both the top gate and the bottom gate. In one embodiment, this through gate contact extends through a top gate structure to a bottom gate structure.

One embodiment of the invention includes a method of making a semiconductor device. The method includes providing a first wafer and providing a second wafer having a first side and a second side. The second wafer includes a semiconductor structure, a gate dielectric, and a layer of gate material. The gate dielectric is located between the semiconductor structure and the layer of gate material. The gate dielectric is located closer to the first side of the second wafer than the semiconductor structure. The method also includes bonding a first side of a second wafer to the first wafer, removing a first portion of the semiconductor structure to leave a layer of the semiconductor structure after the bonding, and forming a transistor having a channel region. At least a portion of the channel region is formed from the layer of the semiconductor structure.

In another embodiment of the invention, a method of forming a transistor includes providing a wafer comprising a semiconductor layer, a gate dielectric, and a layer of gate material. The gate dielectric is located between the semiconductor layer and the layer of gate material. The method also includes patterning the semiconductor layer to leave a first portion of the semiconductor layer and after the patterning the semiconductor layer, patterning the layer of gate material. The patterning the layer of gate material leaves a second portion of the layer of gate material not covered by a remaining portion of the semiconductor layer. After the patterning the layer of gate material, a third portion of the layer of gate material remains and is covered by the first portion of the semiconductor layer. The method also includes forming a bottom gate of a transistor wherein at least a portion of the bottom gate is formed from the third portion.

In another embodiment of the invention, a method of forming a transistor includes providing a wafer comprising a semiconductor layer, a dielectric, a conductive layer, and an insulator. The dielectric is located between the semiconductor layer and the conductive layer and the conductive layer is located between the insulator and the dielectric. The method also includes patterning the semiconductor layer. The patterning leaves a first portion. The method also includes patterning the conductive layer. The patterning the conductive layer leaves a second portion not covered by a remaining portion of the semiconductor layer after the patterning the semiconductor layer. The patterning the conductive layer leaves a third portion covered by the first portion of the semiconductor layer. The patterning the conductive layer leaves a first region where the conductive layer has been removed. The method also includes forming a layer of gate material over the wafer and patterning the layer of gate material. The patterning the layer of gate material leaves a fourth portion over the first portion of the semiconductor layer and a fifth portion over the first region. The method also includes forming a bottom gate of a transistor. At least a portion of the bottom gate is formed from the third portion. The method further includes forming a top gate of the transistor. At least a portion of the top gate is formed from the fourth portion. The transistor includes a channel region, wherein at least a portion of the channel region is located in the first portion.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of forming a transistor, comprising:
   providing a wafer comprising a semiconductor layer, a gate dielectric, and a layer of gate material, wherein the gate dielectric is located between the semiconductor layer and the layer of gate material;

patterning the semiconductor layer to leave a first portion of the semiconductor layer;

after the patterning the semiconductor layer, patterning the layer of gate material, wherein the patterning the layer of gate material leaves a second portion of the layer of gate material not covered by a remaining portion of the semiconductor layer, wherein after the patterning the layer of gate material, a third portion of the layer of gate material remains and is covered by the first portion of the semiconductor layer;

forming a bottom gate of a transistor wherein at least a portion of the bottom gate is formed from the third portion, forming a second layer of gate material after the patterning the layer of gate material;

forming a layer of mask material over the second layer of gate material;

patterning the layer of mask material to form a mask;

forming a top gate of the transistor, wherein the forming a top gate includes patterning the second layer of gate material as per the mask to form a gate structure.

2. The method of claim 1 further comprising:
forming contact over the second portion, the contact is in electrical contact with the second portion.

3. The method of claim 1 wherein the second portion and the third portion are electrically coupled.

4. The method of claim 1 wherein prior to forming the second layer of gate material, the method further comprising:
forming a dielectric over the wafer;
performing a chemical mechanical polish on the wafer after the forming the dielectric.

5. The method of claim 1 further comprising:
implanting dopants into portions of the first portion of the semiconductor layer adjacent to the gate structure;
forming a sidewall spacer around the gate structure;
removing portions of the first portion of the semiconductor layer to leave implanted portions under the sidewall spacer.

6. The method of claim 1, wherein the patterning the layer of gate material is further characterized as leaving a first region where the layer of gate material is removed, wherein:
the forming a second layer of gate material after the patterning the layer of gate material includes forming the second layer of gate material over the first region;
the patterning the second layer of gate material, leaves a fourth portion over the first portion of the semiconductor layer and a fifth portion over the first region;
at least a portion of the top gate is formed from the fourth portion.

7. The method of claim 6 further comprising:
forming a contact over the fifth portion and in electrical contact with the fifth portion.

8. The method of claim 6, further comprising:
implanting dopants into portions of the first portion of the semiconductor layer adjacent to the structure;
forming a sidewall spacer around the structure;
removing portions of the first portion of the semiconductor layer to leave implanted portions under the sidewall spacer.

9. The method of claim 1 further comprising:
forming a first opening in the wafer wherein the forming a first opening forms a first exposed sidewall of the first portion;

forming a second opening in the wafer wherein the forming the second opening includes forming a second exposed sidewall of the first portion;
epitaxially growing semiconductor material on the first exposed sidewall and on the second exposed sidewall.

10. The method of claim 9 further comprising:
forming a first source/drain region of the transistor, wherein the first source/drain region includes epitaxially grown semiconductor material on the first exposed sidewall;
forming a second source/drain region of the transistor wherein the second source/drain region includes epitaxially grown semiconductor material on the second exposed sidewall.

11. The method of claim 10 wherein:
the forming the first source/drain region includes forming material in the first opening, the first source/drain region including at least a portion of the material in the first opening;
the forming the second source/drain region includes forming material in the second opening, the second source/drain region including at least a portion of the material in the second opening.

12. The method of claim 1, wherein the forming the bottom gate further includes:
performing an anisotropic etch of the third portion;
performing an isotropic etch of the third portion after performing the anisotropic etch.

13. The method of claim 1, wherein the providing the wafer comprises:
providing a second wafer;
providing a third wafer comprising a semiconductor structure, the gate dielectric, and the layer of gate material, the gate dielectric is located between the semiconductor structure and the layer of gate material;
bonding the second wafer to the third wafer to form the wafer; and
removing a first portion of the semiconductor structure with the semiconductor layer being a remaining portion of the semiconductor structure.

14. The method of claim 1, wherein the layer of gate material comprises at least one of a group of polysilicon and a metal.

15. The method of claim 1, wherein the semiconductor layer comprises strained silicon.

16. The method of claim 1, wherein the transistor is characterized as a multiple gate transistor.

17. The method of claim 1, wherein the transistor is characterized as a double gate, fully depleted transistor.

18. The method of claim 1, wherein the layer of gate material is located over an insulator.

19. The method of claim 1 further comprising:
forming a resistor, wherein the resistor includes at least a portion of the second portion.

20. The method of claim 1 further comprising:
forming an interconnect, wherein the interconnect includes at least a portion of the second portion.

21. The method of claim 1 further comprising:
forming a capacitor, wherein one electrode of the capacitor includes at least a portion of the second portion.

22. The method of claim 1 further comprising:
forming an inductor, wherein the inductor includes at least a portion of the second portion.

23. A method of forming a transistor comprising:
providing a wafer comprising a semiconductor layer, a dielectric, a conductive layer, and an insulator, wherein the dielectric is located between the semiconductor layer and the conductive layer and the conductive layer is located between the insulator and the dielectric;

patterning the semiconductor layer, wherein the patterning leaves a first portion;

patterning the conductive layer, wherein the patterning the conductive layer leaves a second portion not covered by a remaining portion of the semiconductor layer after the patterning the semiconductor layer, wherein the patterning the conductive layer leaves a third portion covered by the first portion of the semiconductor layer, wherein the patterning the conductive layer leaves a first region where the conductive layer has been removed;

forming a layer of gate material over the wafer;

patterning the layer of gate material, wherein the patterning the layer of gate material leaves a fourth portion over the first portion of the semiconductor layer and a fifth portion over the first region, wherein the patterning the layer of gate material includes forming a layer of mask material over the layer of aate material, patterning the layer of mask material to form a mask, and patterning the layer of gate material as per the mask;

forming a bottom gate of a transistor, wherein at least a portion of the bottom gate is formed from the third portion;

forming a top gate of the transistor, wherein at least a portion of the top gate is formed from the fourth portion;

wherein the transistor includes a channel region, wherein at least a portion of the channel region is located in the first portion.

24. The method of claim 23 further comprising:

forming a contact over the second portion, the contact in electrical contact with the second portion.

25. The method of claim 23, wherein a ground plate is located below the insulator.

26. The method of claim 23 further comprising:

forming a sidewall spacer around the mask.

27. The method of claim 5 wherein the forming the sidewall spacer further includes forming the sidewall spacer around the mask.

28. The method of claim 1 further comprising:

forming a sidewall spacer around the gate structure and the mask.

29. The method of claim 28 further comprising:

forming a second sidewall spacer around the sidewall spacer.

* * * * *

UNITED STATES PATENT AND TRADEMARK OFFICE
CERTIFICATE OF CORRECTION

PATENT NO.         : 7,141,476 B2                          Page 1 of 1
APPLICATION NO.    : 10/871402
DATED              : June 18, 2004
INVENTOR(S)        : Thuy B. Dao It is certified that error appears in the above-identified patent and that said Letters Patent is hereby corrected as shown below:

In Column 11, Line 20, Claim No. 23:
    Change "of mask material over the layer of aate material," to --of mask material over the layer of gate material,--

Signed and Sealed this

Tenth Day of June, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,141,476 B2 | Page 1 of 1 |
| APPLICATION NO. | : 10/871402 | |
| DATED | : November 28, 2006 | |
| INVENTOR(S) | : Thuy B. Dao | |

It is certified that error appears in the above-identified patent and that said Letters Patent is hereby corrected as shown below:

In Column 11, Line 20, Claim No. 23:
    Change "of mask material over the layer of aate material," to --of mask material over the layer of gate material,--

This certificate supersedes the Certificate of Correction issued June 10, 2008.

Signed and Sealed this

Fifteenth Day of July, 2008

JON W. DUDAS
*Director of the United States Patent and Trademark Office*